(12) United States Patent
Chen et al.

(10) Patent No.: US 11,730,265 B2
(45) Date of Patent: Aug. 22, 2023

(54) SLIDE RAIL ASSEMBLY AND SLIDE RAIL KIT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 129 days.

(21) Appl. No.: 17/359,831

(22) Filed: Jun. 28, 2021

(65) Prior Publication Data
US 2022/0354252 A1    Nov. 10, 2022

(30) Foreign Application Priority Data

May 4, 2021    (TW) ................. 110116313

(51) Int. Cl.
*A47B 88/49*   (2017.01)
*A47B 88/43*   (2017.01)
*A47B 88/477*  (2017.01)

(52) U.S. Cl.
CPC .............. *A47B 88/49* (2017.01); *A47B 88/43* (2017.01); *A47B 88/477* (2017.01)

(58) Field of Classification Search
CPC ........ A47B 88/49; A47B 88/483; A47B 88/43; A47B 88/477; H05K 7/1489
See application file for complete search history.

(56) References Cited

U.S. PATENT DOCUMENTS

| | | | | |
|---|---|---|---|---|
| 6,450,600 B1 * | 9/2002 | Chen | ................... | A47B 88/493 312/334.46 |
| 6,824,233 B2 * | 11/2004 | Chen | ................... | A47B 88/487 312/334.44 |
| 7,648,214 B2 * | 1/2010 | Chen | ................... | A47B 88/493 312/334.47 |
| 9,078,349 B1 * | 7/2015 | Lewis | ................... | H05K 5/0204 |
| 9,856,912 B2 * | 1/2018 | Chen | ................... | A47B 88/57 |

(Continued)

FOREIGN PATENT DOCUMENTS

| | | |
|---|---|---|
| EP | 3144457 A1 | 3/2017 |
| EP | 3451808 A1 | 3/2019 |

(Continued)

OTHER PUBLICATIONS

Official Action Issued By Foreign Patent Office in Application No. 21184219.0-1203 dated Jan. 7, 2022.

*Primary Examiner* — Hanh V Tran
(74) *Attorney, Agent, or Firm* — Rosenberg, Klein & Lee

(57) ABSTRACT

A slide rail assembly adapted for a rack includes a first slide rail, a fitting, and a second slide rail. The first slide rail is movable with respect to the rack between a first position and a second position. The fitting is configured to be mounted on the first slide rail and includes at least one guiding structure. The second slide rail is configured to be guided by the at least one guiding structure of the fitting while being outside a channel of the first slide rail and thus enter the channel.

8 Claims, 15 Drawing Sheets

(56) References Cited

U.S. PATENT DOCUMENTS

| | | | | |
|---|---|---|---|---|
| 10,092,100 B1* | 10/2018 | Chen | | A47B 88/40 |
| 10,260,556 B2* | 4/2019 | Chen | | A47B 88/483 |
| 10,314,394 B2 | 6/2019 | Chen et al. | | |
| 10,390,454 B2 | 8/2019 | Chen et al. | | |
| 10,563,429 B1* | 2/2020 | Bailey | | E05B 35/008 |
| 10,687,438 B2 | 6/2020 | Chen et al. | | |
| 11,213,124 B2* | 1/2022 | Chen | | A47B 88/493 |
| 2004/0080245 A1* | 4/2004 | Lammens | | A47B 88/49 |
| | | | | 312/334.46 |
| 2004/0145285 A1* | 7/2004 | Hwang | | A47B 88/493 |
| | | | | 312/334.45 |
| 2005/0017614 A1* | 1/2005 | Cirocco | | A47B 88/49 |
| | | | | 312/333 |
| 2008/0150409 A1* | 6/2008 | Huang | | A47B 88/493 |
| | | | | 312/334.46 |
| 2008/0303399 A1* | 12/2008 | Huang | | A47B 88/49 |
| | | | | 312/334.46 |
| 2010/0072153 A1* | 3/2010 | Chen | | A47B 88/43 |
| | | | | 248/220.21 |
| 2012/0187816 A1* | 7/2012 | Chen | | E05B 65/463 |
| | | | | 312/334.8 |
| 2013/0058596 A1* | 3/2013 | Chen | | F16C 29/048 |
| | | | | 384/7 |
| 2015/0245709 A1* | 9/2015 | Iwamoto | | A47B 88/57 |
| | | | | 211/175 |
| 2016/0029791 A1* | 2/2016 | Chen | | H05K 7/183 |
| | | | | 312/334.44 |
| 2016/0278234 A1* | 9/2016 | Chen | | A47B 96/067 |
| 2017/0079428 A1* | 3/2017 | Chen | | H05K 7/1489 |
| 2017/0119153 A1* | 5/2017 | Chen | | A47B 88/443 |
| 2017/0303426 A1* | 10/2017 | Chen | | A47B 96/07 |
| 2019/0063493 A1* | 2/2019 | Chen | | A47B 88/483 |
| 2019/0373759 A1* | 12/2019 | Chen | | H05K 5/0204 |

FOREIGN PATENT DOCUMENTS

| | | | | |
|---|---|---|---|---|
| EP | 3634094 A1 * | 4/2020 | | A47B 88/447 |
| EP | 3782513 A1 * | 2/2021 | | A47B 88/43 |
| EP | 3782513 A1 | 2/2021 | | |
| GB | 2446674 A * | 8/2008 | | A47B 88/047 |
| GB | 2476071 A * | 6/2011 | | A47B 88/493 |
| JP | 2019037749 A | 3/2019 | | |
| TW | I565396 B * | 11/2015 | | |
| TW | 712380 B | 12/2020 | | |

* cited by examiner

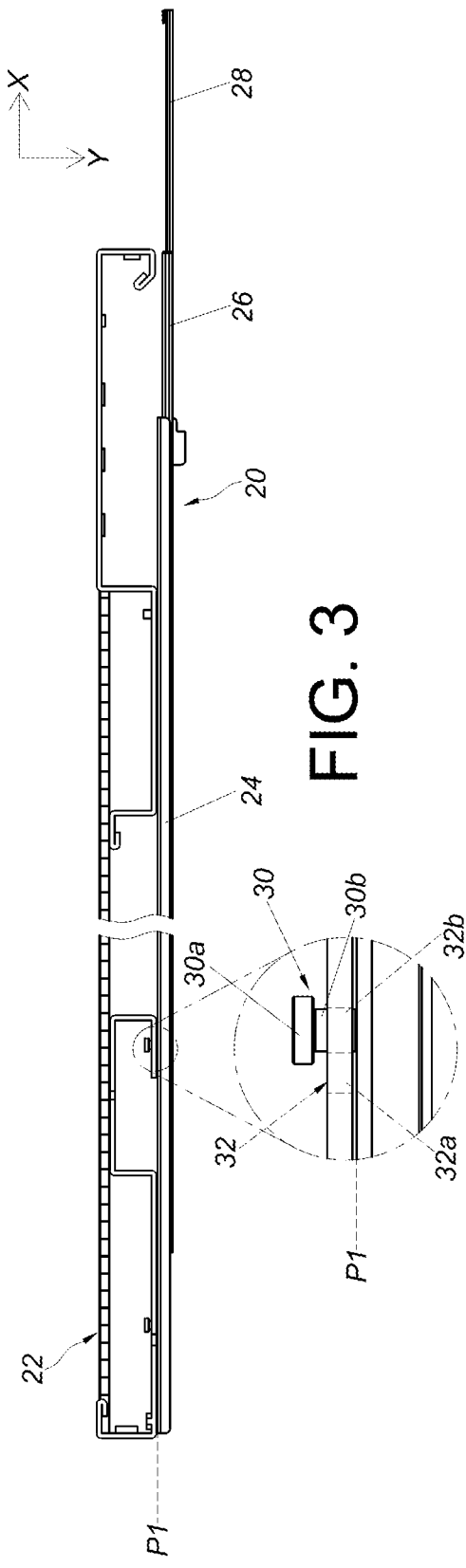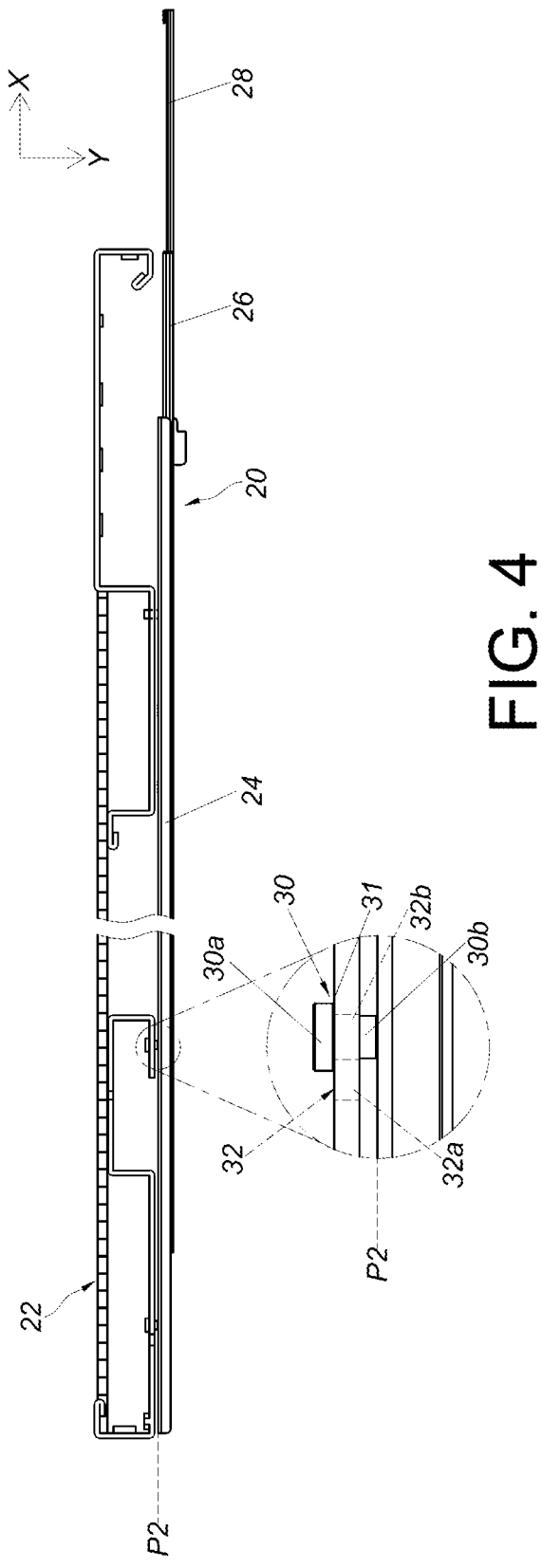

SLIDE RAIL ASSEMBLY AND SLIDE RAIL KIT THEREOF

FIELD OF THE INVENTION

The present invention relates to a slide rail. More particularly, the invention relates to a slide rail assembly in which a fitting makes it easier to mount two slide rails of the assembly with respect to each other, and to a slide rail kit of the assembly.

BACKGROUND OF THE INVENTION

A rack system is generally so designed that two slide rail assemblies (e.g., a first slide rail assembly and a second slide rail assembly) can be mounted on two lateral sides of a rack respectively. Each slide rail assembly includes a first rail, a second rail, and a third rail, all of which can be moved with respect to one another. The first rails are fixed on the rack. Each second rail is movably mounted between the corresponding first rail and the corresponding third rail, and each third rail can be detached from, or moved out of a channel of, the corresponding second rail. An object can be mounted on the rack by first mounting the two detached third rails on two lateral sides of the object respectively, and then inserting the two third rails back into the two second rails respectively.

Sometimes, however, a user trying to mount an object on the rack may find it difficult to align the third rails with the channels of the second rails respectively, either because the object is blocking the user's view or because of other factors, and the difficulty of alignment causes inconvenience in mounting the third rails and the second rails with respect to each other. In addition, the fact that the first rails are fixed on the rack, and hence immovable with respect to the rack, is disadvantageous to the mounting tolerance between the object and the rack.

SUMMARY OF THE INVENTION

The present invention relates to a slide rail assembly and a slide rail kit thereof. The slide rail assembly includes a fitting that makes it easier to mount two slide rails of the slide rail assembly with respect to each other.

According to one aspect of the present invention, a slide rail assembly adapted for a rack includes a first rail, a second rail, a fitting, and a third rail. The first rail is movably mounted on the rack and can be moved transversely with respect to the rack between a first position and a second position. The second rail is movably mounted on the first rail and can be displaced longitudinally with respect to the first rail. The second rail includes a first end portion, a second end portion, and a channel located between the first end portion and the second end portion. The fitting is configured to be disposed adjacent to the first end portion of the second rail and includes at least one guiding structure. The third rail can be guided by the at least one guiding structure of the fitting while being outside the channel of the second rail and thus enter the channel of the second rail.

Preferably, the second rail includes a first wall, a second wall, and a longitudinal wall connected between the first wall and the second wall of the second rail. The first wall, the second wall, and the longitudinal wall of the second rail jointly define the channel.

Preferably, the fitting includes a first portion, a second portion, and a side portion connected between the first portion and the second portion. The first portion, the second portion, and the side portion jointly define an auxiliary channel that corresponds to the channel of the second rail.

Preferably, the fitting is detachably mounted on the second rail such that the first portion, the second portion, and the side portion of the fitting are adjacent to the first wall, the second wall, and the longitudinal wall of the second rail respectively.

Preferably, the fitting has two opposite sides defined respectively as a first side and a second side, the auxiliary channel and the at least one guiding structure are located on the first side, and the fitting is further provided with a predetermined structure on the second side. The predetermined structure is configured for contact with the rack.

Preferably, with the first rail being transversely movable with respect to the rack between the first position and the second position, a mounting tolerance between an object mounted on the third rail and the rack is provided.

According to another aspect of the present invention, a slide rail assembly adapted for a rack includes a first rail, a second rail, and a fitting. The first rail is movably mounted on the rack and can be moved transversely with respect to the rack between a first position and a second position. The second rail is movably mounted on the first rail and can be displaced longitudinally with respect to the first rail. The fitting is configured to be detachably mounted on a first end portion of the second rail when the second rail is at an extended position with respect to the first rail, i.e., when the first end portion of the second rail extends beyond a first end portion of the first rail.

Preferably, the second rail further has a second end portion and a channel. The channel is located between the first end portion and the second end portion of the second rail.

Preferably, the fitting includes at least one guiding structure, and the slide rail assembly further includes a third rail. The third rail can be guided by the at least one guiding structure of the fitting while being outside the channel of the second rail and thus enter the channel of the second rail.

Preferably, the at least one guiding structure of the fitting includes an inclined surface or a curved surface.

Preferably, the second rail includes a first wall, a second wall, and a longitudinal wall connected between the first wall and the second wall of the second rail, and the fitting includes a first portion, a second portion, and a side portion connected between the first portion and the second portion. The first wall, the second wall, and the longitudinal wall of the second rail jointly define the channel. The first portion, the second portion, and the side portion of the fitting jointly define an auxiliary channel that corresponds to the channel of the second rail.

Preferably, the first portion, the second portion, and the side portion of the fitting are respectively adjacent to the first wall, the second wall, and the longitudinal wall of the second rail when the fitting is mounted on the second rail.

Preferably, the fitting has two opposite sides defined respectively as a first side and a second side, the auxiliary channel and the at least one guiding structure are located on the first side, and the fitting is further provided with a predetermined structure on the second side. The predetermined structure is configured for contact with the rack.

Preferably, with the first rail being transversely movable with respect to the rack between the first position and the second position, the third rail can be mounted with objects of different predetermined widths separately.

According to yet another aspect of the present invention, a slide rail kit includes a first slide rail, a fitting, and a second slide rail. The fitting is configured to be disposed on the first slide rail and includes at least one guiding structure. The second slide rail is configured to be guided by the at least one guiding structure of the fitting while being outside a channel of the first slide rail and thus enter the channel of the first slide rail. The fitting further includes at least one blocking portion, and the at least one blocking portion is configured to abut against the first slide rail.

Preferably, the first slide rail includes a first end portion and a second end portion in addition to the channel, which is located between the first end portion and the second end portion of the first slide rail, and the fitting is configured to be disposed adjacent to the first end portion of the first slide rail.

Preferably, the first slide rail includes a first wall, a second wall, and a longitudinal wall connected between the first wall and the second wall of the first slide rail. The first wall, the second wall, and the longitudinal wall of the first slide rail jointly define the channel.

Preferably, the fitting includes a first portion, a second portion, and a side portion connected between the first portion and the second portion. The first portion, the second portion, and the side portion of the fitting are respectively adjacent to the first wall, the second wall, and the longitudinal wall of the first slide rail when the fitting is mounted on the first slide rail.

Preferably, the fitting has a first side, and the at least one guiding structure is located on the first side.

Preferably, the fitting further has a second side, which is the opposite side of the first side, and the fitting is further provided with a predetermined structure on the second side. The predetermined structure is an elastic section.

BRIEF DESCRIPTION OF THE DRAWINGS

FIG. 3 shows the slide rail assembly at a first position with respect to the rack according to the embodiment of the present invention;

FIG. 4 shows the slide rail assembly at a second position with respect to the rack according to the embodiment of the present invention;

DETAILED DESCRIPTION OF THE INVENTION

Figure 1:
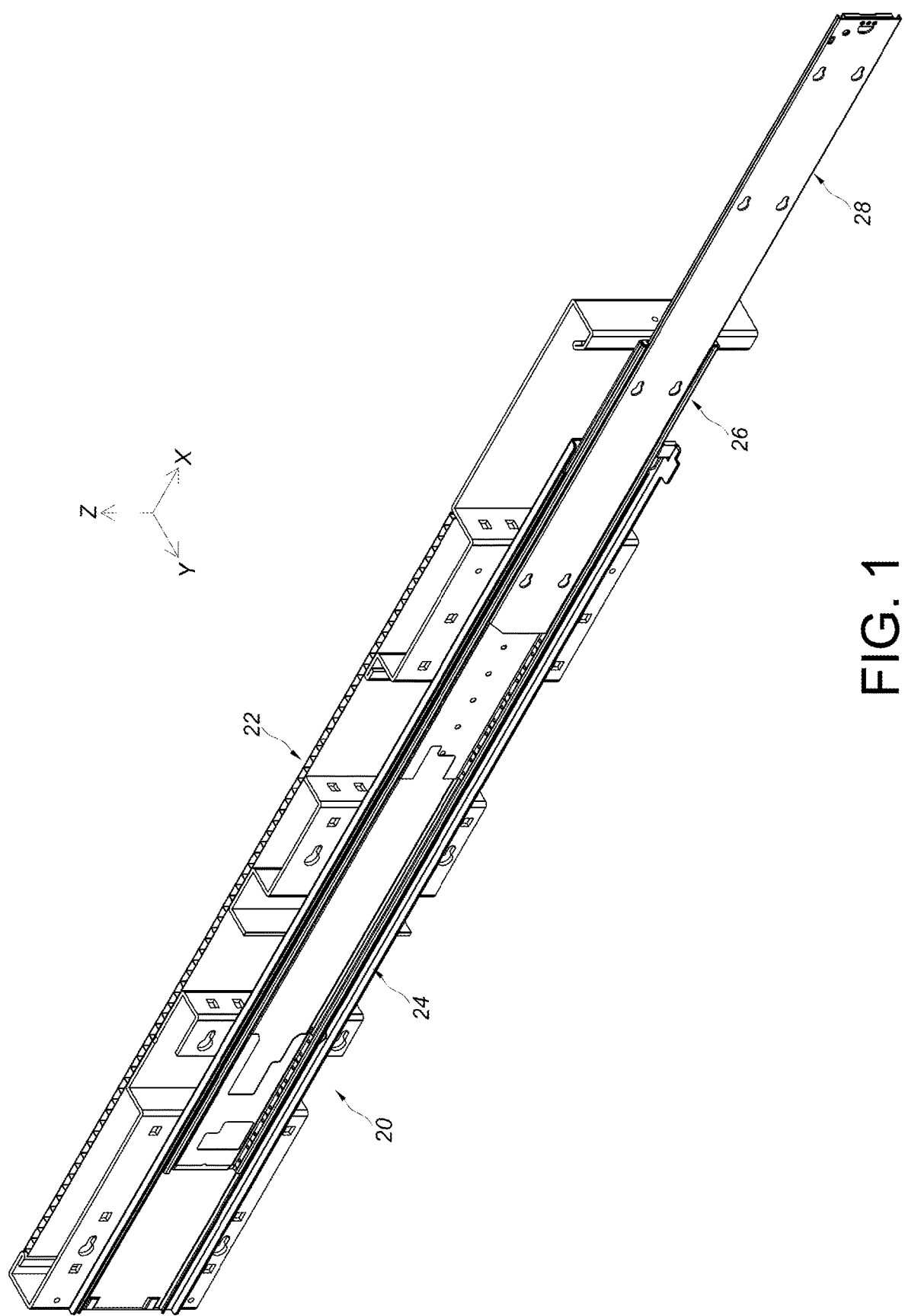
FIG. 1 is a perspective view of the slide rail assembly according to an embodiment of the present invention, showing the slide rail assembly mounted on a rack.
Figure 2:
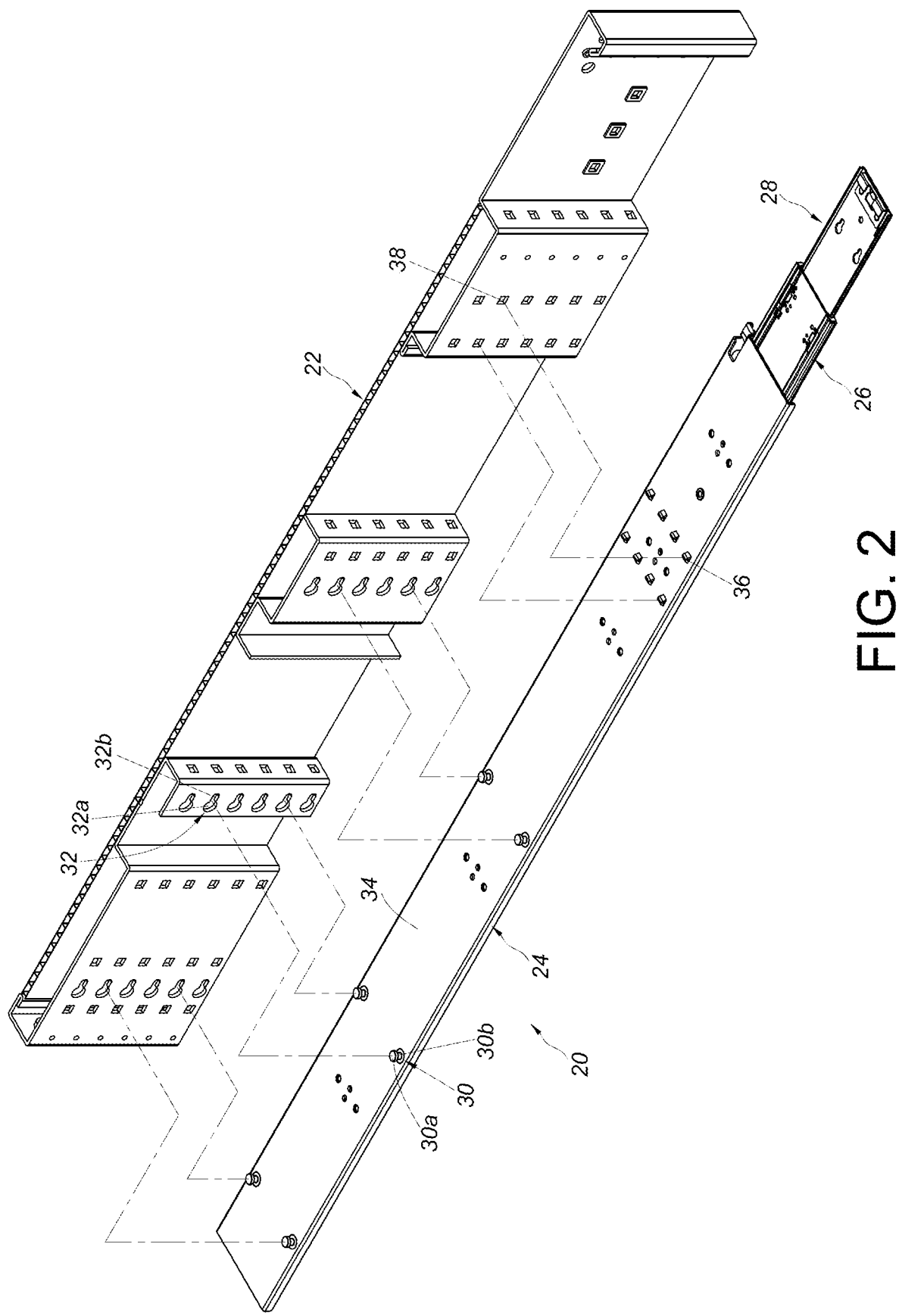
FIG. 2 is a perspective view showing the slide rail assembly separated from the rack according to the embodiment of the present invention.

Referring to FIG. 1 and FIG. 2, the slide rail assembly 20 according to an embodiment of the present invention is adapted for a rack 22. The slide rail assembly 20 includes a first rail 24, a second rail 26 (also referred to as the first slide rail when mentioned in relation to the slide rail kit of the invention), and preferably also a third rail 28 (also referred to as the second slide rail when mentioned in relation to the slide rail kit of the invention). The first rail 24, the second rail 26, and the third rail 28 can be longitudinally displaced with respect to one another. The second rail 26 is movably mounted between the first rail 24 and the third rail 28. It is worth mentioning that in this embodiment, the X-axis direction is defined as the longitudinal direction (or the length direction of the rails), the Y-axis direction as the transverse direction (or the lateral direction of the rails), and the Z-axis direction as the vertical direction (or the height direction of the rails).

The first rail 24 is mounted on the rack 22 in a movable (e.g., transversely movable) manner. Here, by way of example, one of the first rail 24 and the rack 22 (or more specifically one lateral side thereof) is provided with at least one first feature 30, and the other of the first rail 24 and the rack 22 (or more specifically the lateral side thereof) is provided with at least one second feature 32. The first feature 30 and the second feature 32 match, and can work with, each other to enable the first rail 24 to be moved with respect to the rack 22.

More specifically, the first rail 24 is provided with the first feature 30, and the first feature 30 is a protruding element protruding transversely (or laterally) with respect to a longitudinal wall 34 of the first rail 24. The first feature 30 includes a head portion 30a and a body portion 30b. The body portion 30b is connected between the longitudinal wall 34 and the head portion 30a, and the head portion 30a is larger in size than the body portion 30b. The rack 22 (or more specifically the lateral side thereof) is provided with the second feature 32, and the second feature 32 is a hole. The second feature 32 includes a first hole portion 32a and a second hole portion 32b in communication with the first hole portion 32a, and the first hole portion 32a is larger in size than the second hole portion 32b. It is worth mentioning that the head portion 30a is smaller in size than the first hole portion 32a, and that the head portion 30a is larger in size than the second hole portion 32b.

Preferably, the one of the first rail 24 and the rack 22 is further provided with at least one third feature 36, and the other of the first rail 24 and the rack 22 is further provided with at least one fourth feature 38. The third feature 36 and the fourth feature 38 are matching structures, such as a projecting portion and a matching recessed portion (e.g., a hole or groove). For example, the third feature 36 can extend into the fourth feature 38 to enhance the reliability of the first rail 24 being mounted on the rack 22.

In the course in which the first rail 24 of the slide rail assembly 20 is mounted to the rack 22 (or more specifically the lateral side thereof), referring to FIG. 3 and FIG. 4, the first feature 30 extends into the first hole portion 32a of the second feature 32, and then the first rail 24 is moved in a certain direction such that the body portion 30b of the first feature 30 enters the second hole portion 32b of the second feature 32. Since the head portion 30a of the first feature 30 is larger in size than the second hole portion 32b, the head portion 30a of the first feature 30 will correspond to a sidewall portion 31 of the rack 22 that surrounds the second hole portion 32b, thereby preventing the first feature 30 from separating from the second hole portion 32b of the second feature 32 in the transverse direction, and hence completing the process of mounting the first rail 24 of the slide rail assembly 20 on the rack 22. The body portion 30b of the first feature 30 has a predetermined transverse length to allow the first rail 24 to be moved transversely with respect to the rack 22. For example, the first rail 24 can be transversely moved from a first position P1 (see FIG. 3) to a second position P2 (see FIG. 4) with respect to the rack 22, or the first rail 24 can be transversely moved from the second position P2 to the first position P1 with respect to the rack 22, or the first rail 24 can reach any position between the first position P1 and the second position P2 after being moved with respect to the rack 22.

Figure 5:
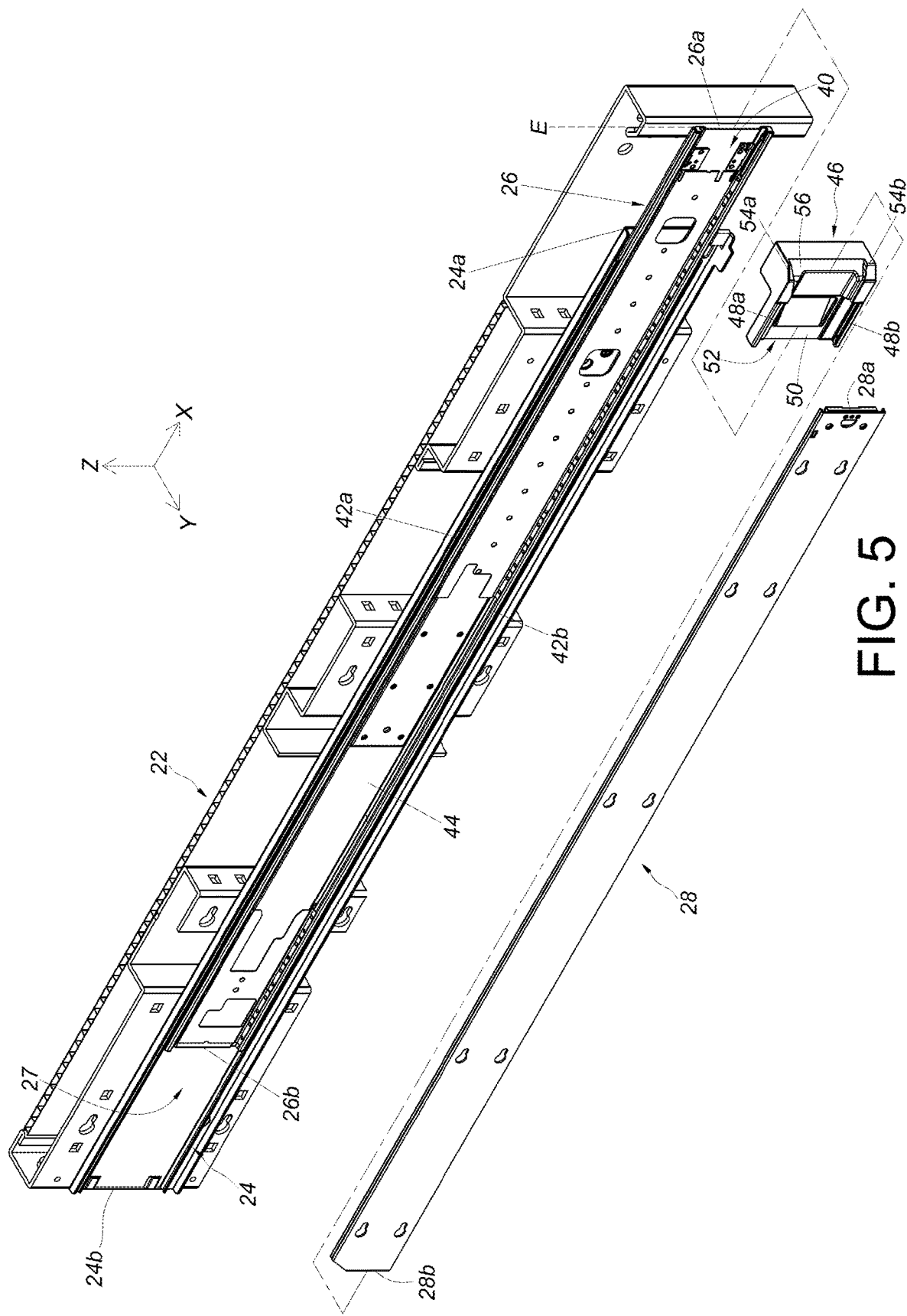
FIG. 5 is an exploded perspective view of the slide rail assembly according to the embodiment of the present invention, showing that the slide rail assembly is mounted on the rack and further includes a fitting for guiding a third rail of the slide rail assembly into a second rail of the slide rail assembly.
Figure 6:
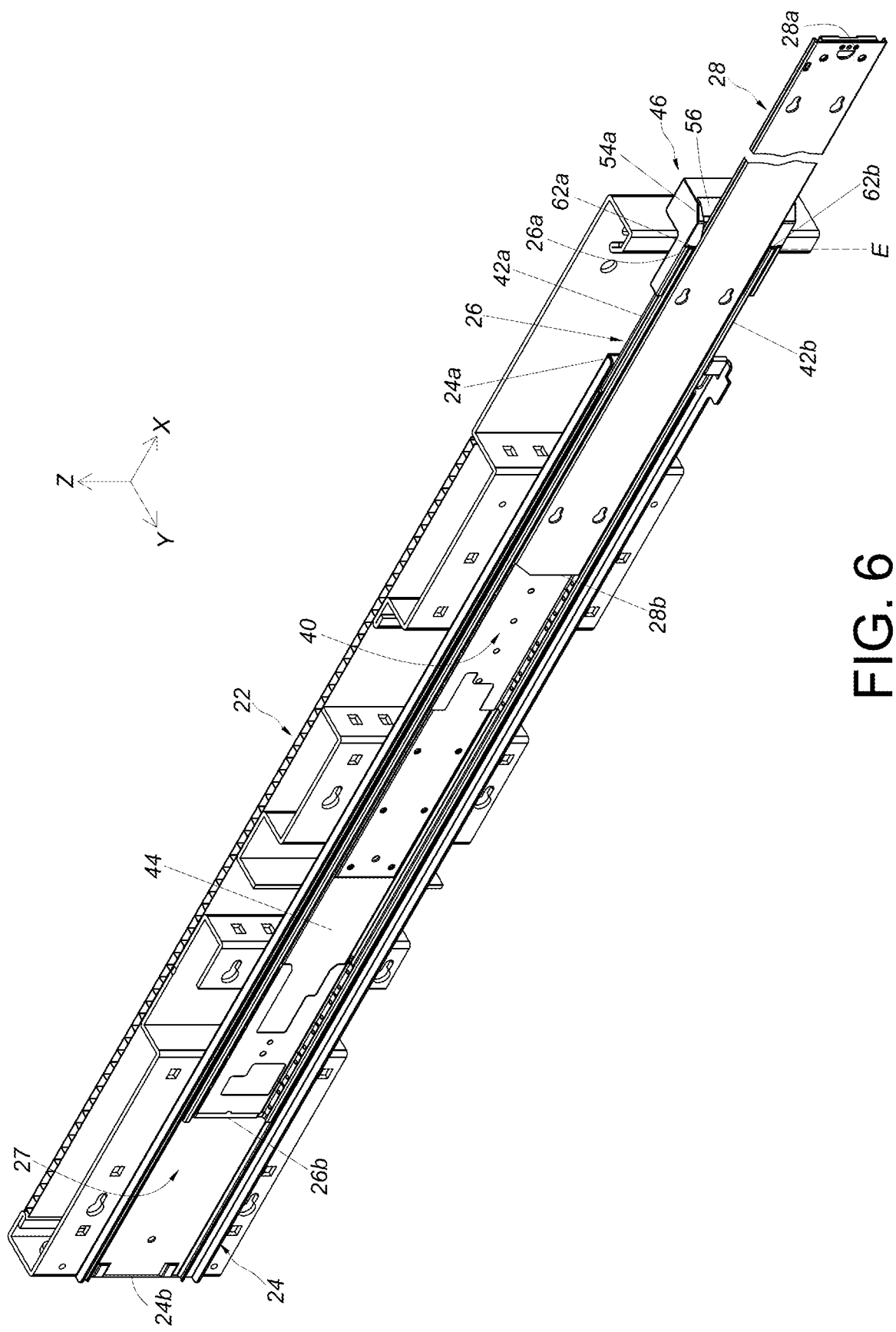
FIG. 6 shows the slide rail assembly in the assembled state and mounted on the rack along with the fitting according to the embodiment of the present invention.

Referring to FIG. 5 and FIG. 6, the first rail 24 has two opposite end portions defined respectively as a first end portion 24a and a second end portion 24b, such as but not limited to a front end portion and a rear end portion. The first rail 24 has a channel 27 located between the first end portion 24a and the second end portion 24b of the first rail 24.

The second rail 26 is mounted in the channel 27 of the first rail 24 in a movable manner. The second rail 26 can be longitudinally displaced with respect to the first rail 24. The second rail 26 has two opposite end portions defined respectively as a first end portion 26a and a second end portion 26b, and a channel 40 located between the first end portion 26a and the second end portion 26b of the second rail 26. The first end portion 26a and the second end portion 26b may be, for example but not limited to, a front end portion and a rear end portion.

Preferably, the second rail 26 includes a first wall 42a, a second wall 42b, and a longitudinal wall 44 connected between the first wall 42a and the second wall 42b of the second rail 26. The first wall 42a, the second wall 42b, and the longitudinal wall 44 of the second rail 26 jointly define the channel 40.

The third rail 28 is mounted in the channel 40 of the second rail 26 in a movable and detachable manner. For example, the third rail 28 can be longitudinally displaced with respect to the second rail 26 and thereby detached from, or moved out of the channel 40 of, the second rail 26, or the detached third rail 28 can be inserted back into and thus mounted in the channel 40 of the second rail 26. The third rail 28 has two opposite end portions defined respectively as a first end portion 28a and a second end portion 28b, such as but not limited to a front end portion and a rear end portion.

The slide rail assembly 20 further includes a fitting 46 configured to be disposed on the second rail 26. For example, the fitting 46 may be mounted on the second rail 26 in a detachable manner or be integrally formed with the second rail 26. In this embodiment, the fitting 46 is detachably mounted on the second rail 26 by way of example only. More specifically, the fitting 46 is located adjacent to the first end portion 26a of the second rail 26. The second rail 26, the third rail 28, and the fitting 46 constitute a slide rail kit.

Figure 7:
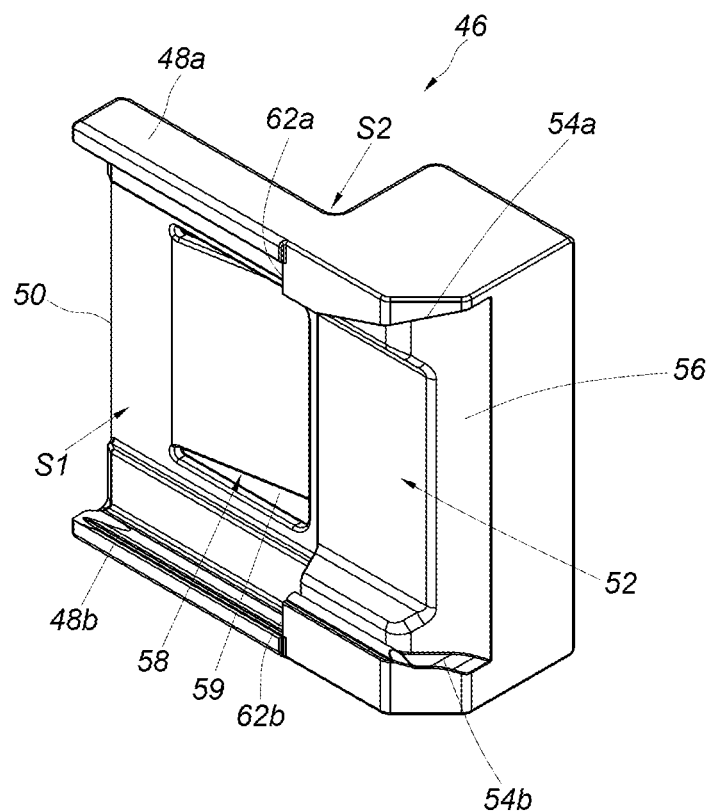
FIG. 7 is a perspective view of the fitting according to the embodiment of the present invention.
Figure 8:
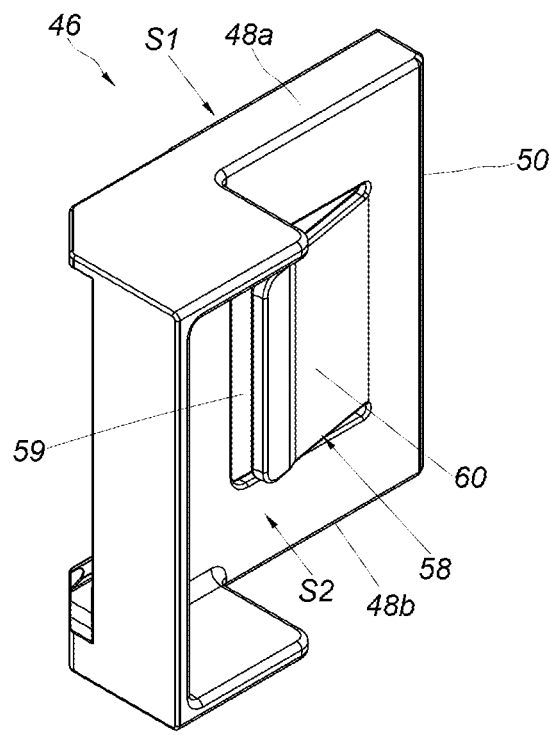
FIG. 8 shows the fitting according to the embodiment of the present invention from another viewing angle.

Preferably, the fitting 46 includes a first portion 48a, a second portion 48b, and a side portion 50 connected between the first portion 48a and the second portion 48b (see also FIG. 7 and FIG. 8). The first portion 48a, the second portion 48b, and the side portion 50 jointly define an auxiliary channel 52 that corresponds to (or is in alignment with) the channel 40 of the second rail 26.

Preferably, the first portion 48a, the second portion 48b, and the side portion 50 of the fitting 46 are respectively adjacent to the first wall 42a, the second wall 42b, and the longitudinal wall 44 of the second rail 26 when the fitting 46 is mounted on the second rail 26.

Preferably, the fitting 46 includes at least one guiding structure corresponding to the channel 40 of the second rail 26. The third rail 28 can be guided by the at least one guiding structure of the fitting 46 while being outside the channel 40 of the second rail 26 and thus enter the channel 40 of the second rail 26.

Preferably, the at least one guiding structure includes a first guiding portion 54a, a second guiding portion 54b, and a third guiding portion 56 located between the first guiding portion 54a and the second guiding portion 54b. The first guiding portion 54a, the second guiding portion 54b, and the third guiding portion 56 are adjacent to a channel opening of the auxiliary channel 52 (see FIG. 7). For example, the first guiding portion 54a, the second guiding portion 54b, or the third guiding portion 56 includes an inclined or curved surface that gradually widens toward the channel opening. While the third rail 28 is being inserted into the channel 40 of the second rail 26 from outside the channel 40 of the second rail 26, one of the first guiding portion 54a, the second guiding portion 54b, and the third guiding portion 56 can guide the second end portion 28b of the third rail 28 into the auxiliary channel 52 first so as to facilitate insertion of the third rail 28 into the channel 40 of the second rail 26.

Preferably, the fitting 46 has two opposite sides defined respectively as a first side S1 and a second side S2 (see FIG. 7 and FIG. 8). The auxiliary channel 52 and the at least one guiding structure (e.g., the first guiding portion 54a, the second guiding portion 54b, and the third guiding portion 56) are located on the first side S1 (as shown in FIG. 7), and the fitting 46 is further provided with a predetermined structure 58 on the second side S2 (as shown in FIG. 8).

Preferably, the predetermined structure 58 provides the fitting 46 with elasticity. More specifically, the predetermined structure 58 is an elastic section (e.g., an elastic arm or other elastic structure) connected to the side portion 50 of the fitting 46, and the predetermined structure 58 tilts upward with respect to the second side S2 of the side portion 50.

Preferably, the side portion 50 of the fitting 46 has an opening 59 that brings the first side S1 and the second side S2 into communication. The opening 59 corresponds in position to the predetermined structure 58, and the opening 59 is slightly larger in size than the predetermined structure 58.

Preferably, the predetermined structure 58 includes a guiding feature 60, and the guiding feature 60 is an inclined or curved surface.

Preferably, the fitting 46 further has at least one blocking portion. Here, a first blocking portion 62a and a second blocking portion 62b are provided on the first side S1 of the fitting 46 by way of example only. When the fitting 46 is mounted on the second rail 26, the first blocking portion 62a and the second blocking portion 62b produce a blocking effect by abutting against the first wall 42a and the second wall 42b of the first end portion 26a of the second rail 26 respectively (see FIG. 6) such that the fitting 46 is mounted on the second rail 26 in a highly reliable or stable manner.

Figure 9:
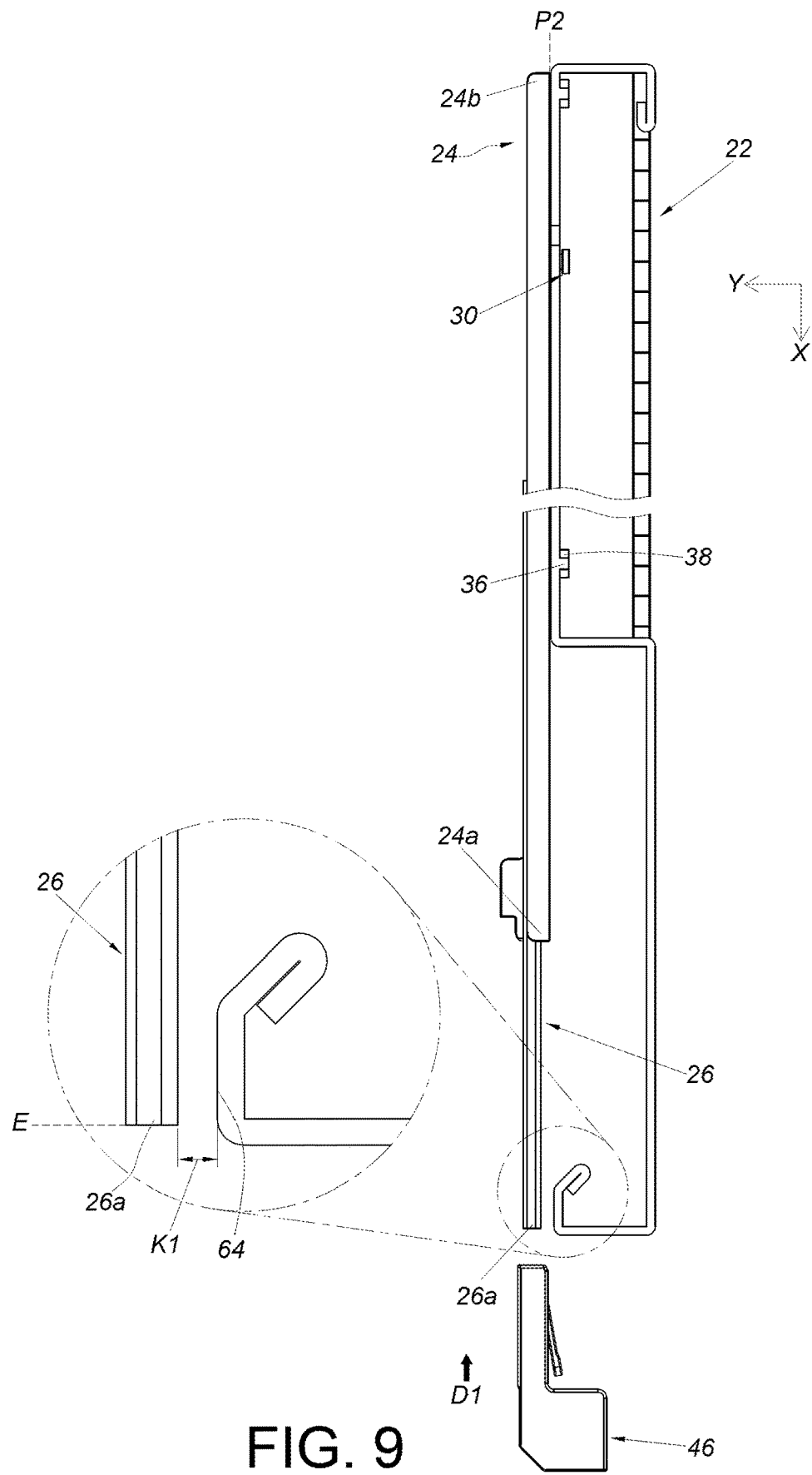
FIG. 9 shows that the slide rail assembly according to the embodiment of the present invention is mounted on the rack, with the fitting about being moved in a predetermined direction in order to be mounted to the second rail.
Figure 10:
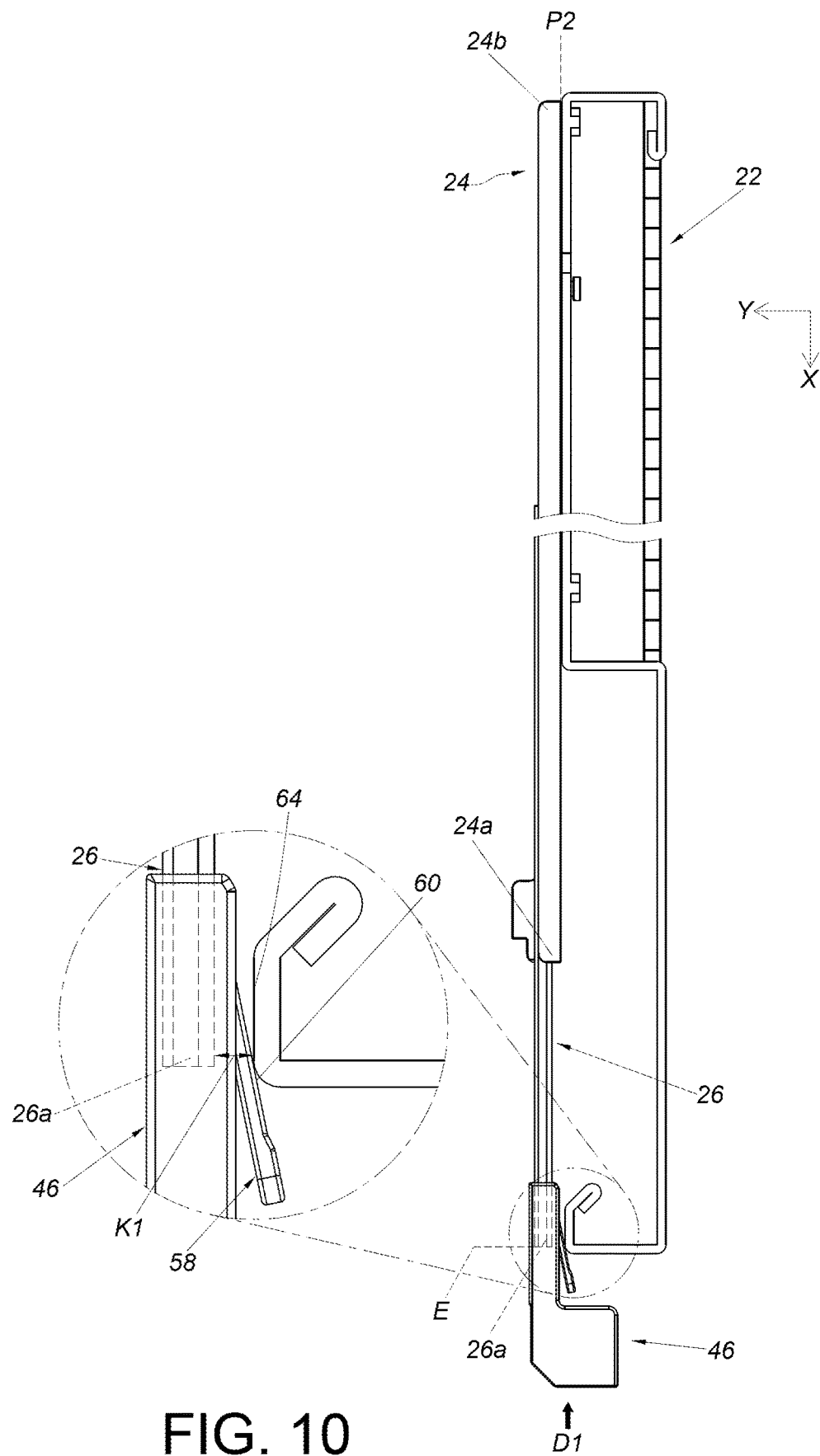
FIG. 10 shows that the slide rail assembly according to the embodiment of the present invention is mounted on the rack, with the fitting being further moved in the predetermined direction in order to be mounted on the second rail.
Figure 11:
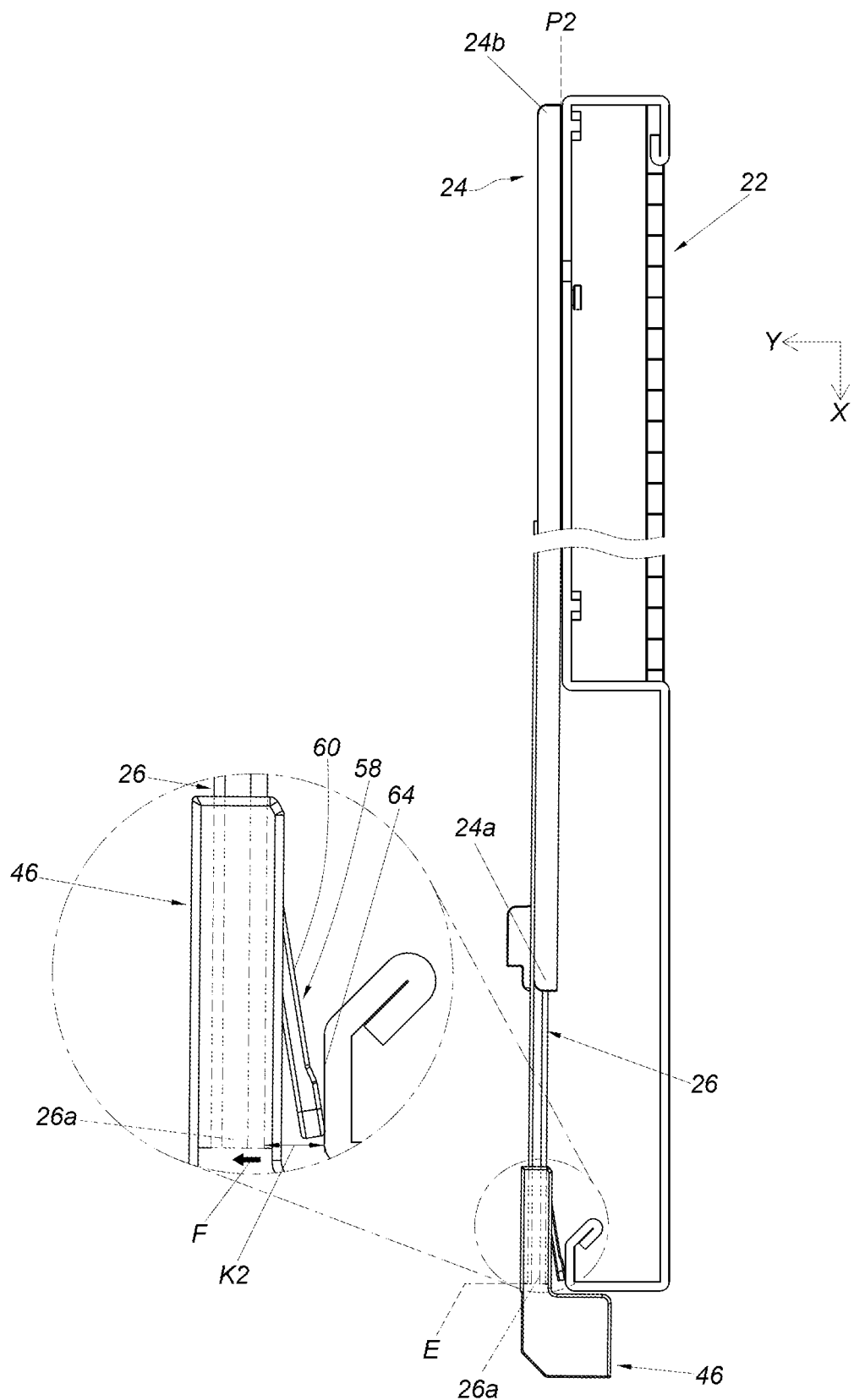
FIG. 11 shows that the slide rail assembly according to the embodiment of the present invention is mounted on the rack, with the fitting being mounted on the second rail.

When the second rail 26 is at an extended position E with respect to the first rail 24, referring to FIG. 9, FIG. 10, and FIG. 11 (in each of which the third rail 28 is omitted), the first end portion 26a of the second rail 26 extends beyond the first end portion 24a of the first rail 24, and a user can now mount the fitting 46 to the first end portion 26a of the second rail 26 in a predetermined direction D1.

It is worth mentioning that when the first rail 24 is at the second position P2 with respect to the rack 22, or at the first position P1 with respect to the rack 22, or at any position between the first position P1 and the second position P2 and the second rail 26 is at the extended position E with respect to the first rail 24, a space exists between the first end portion 26a of the second rail 26 and a predetermined portion 64 (e.g., a wall surface) of the rack 22, wherein the size of the space depends on the position of the first rail 24 with respect to the rack 22. Here, by way of example, a first space K1 exists between the first end portion 26a of the second rail 26 at the extended position E and the predetermined portion 64 of the rack 22 when the first rail 24 is at the second position P2 with respect to the rack 22 (see FIG. 9 and FIG. 10).

Preferably, the predetermined structure 58 enables the fitting 46 to adapt to the first rail 24 being at the second position P2 with respect to the rack 22 (or at the first position P1 with respect to the rack 22, or at any position between the first position P1 and the second position P2) so that the fitting 46 can be mounted on the second rail 26.

More specifically, in the course in which the fitting 46 is mounted to the second rail 26 in the predetermined direction D1, the predetermined structure 58 (or the guiding feature 60 thereof to be exact) of the fitting 46 is brought into contact with the predetermined portion 64 of the rack 22 (as shown in FIG. 10). This contact helps the predetermined structure 58 enter the first space K1. When moved further in the predetermined direction D1, the fitting 46 will end up mounted on the second rail 26 and adjacent to the first end portion 26a of the second rail 26 (as shown in FIG. 11). When the fitting 46 is mounted on the second rail 26, the predetermined structure 58 of the fitting 46 remains in contact with the predetermined portion 64 of the rack 22 and applies a force F (e.g., an elastic force, as shown in FIG. 11) to the second rail 26. The first end portion 26a of the second rail 26 responds to the force F by deflecting slightly (i.e., through a small angle) away from the predetermined portion 64 of the rack 22; as a result, the first space K1 (see FIG. 10) between the first end portion 26a of the second rail 26 and the predetermined portion 64 of the rack 22 becomes a second space K2 slightly larger than the first space K1 (see FIG. 11).

Figure 12:
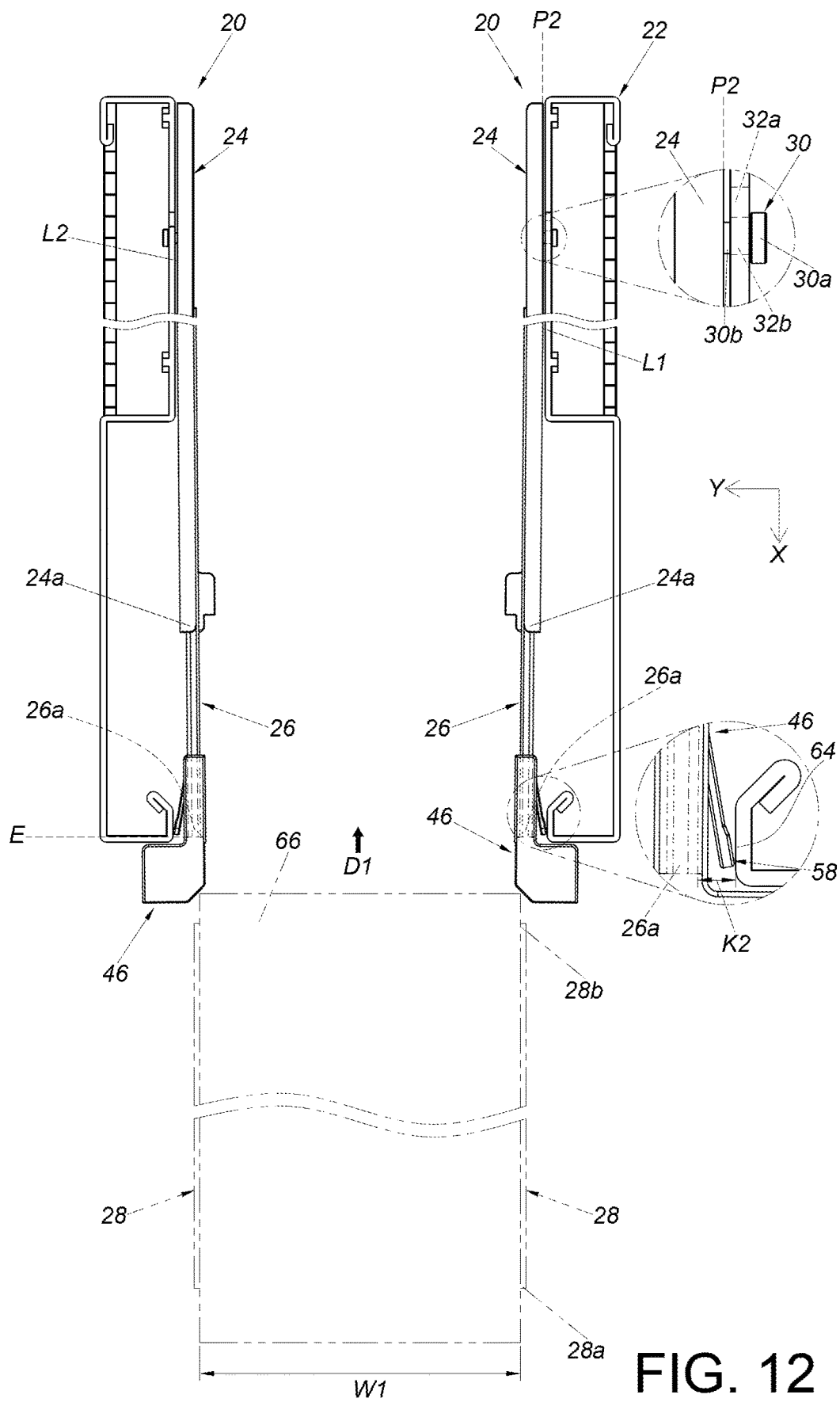
FIG. 12 shows that the two lateral sides of the rack are mounted respectively with two slide rail assemblies along with their respective fittings according to the embodiment of the present invention, and that the two lateral sides of a first object are moved in the predetermined direction via the third rails in order to be mounted to the second rails respectively.
Figure 13:
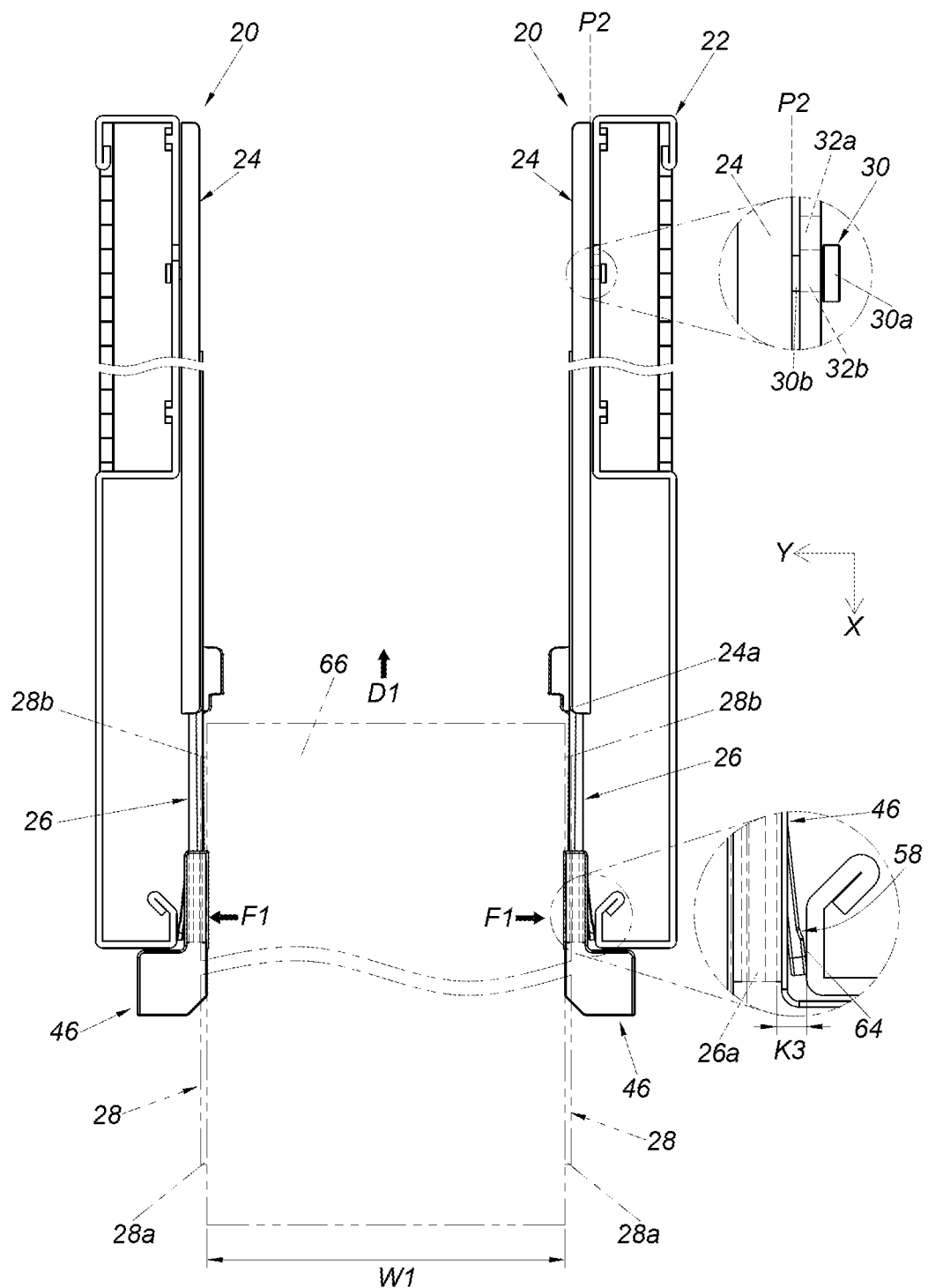
FIG. 13 shows that the two lateral sides of the rack are mounted respectively with two slide rail assemblies along with their respective fittings according to the embodiment of the present invention, and that the two lateral sides of the first object are further moved in the predetermined direction via the third rails in order to be mounted on the second rails respectively.

Referring to FIG. 12 and FIG. 13, the rack 22 has two lateral sides. Two slide rail assemblies 20 of substantially the same structural configuration can be mounted on the two opposite lateral sides (e.g., a first lateral side L1 and a second lateral side L2) of the rack 22 respectively. The first lateral side L1 and the second lateral side L2 define a rack width therebetween. In FIG. 12, the first rail 24 of each slide rail assembly 20 is at the second position P2 with respect to the rack 22, and the second rail 26 of each slide rail assembly 20 is at the extended position E with respect to the corresponding first rail 24, with the second space K2 existing between the first end portion 26a of each second rail 26 and the corresponding predetermined portion 64 of the rack 22.

On the other hand, the third rail 28 of each slide rail assembly 20 is disposed on one of the two lateral sides of a first object 66 so that the two lateral sides of the first object 66 can be mounted to the two second rails 26 (or more specifically into the channels 40 thereof) in the predetermined direction D1 via the two third rails 28 respectively. The first object 66 has a first predetermined width W1. While the first object 66 is being mounted to the second rails 26 in the predetermined direction D1 via the third rails 28 respectively, the second end portion 28b of each third rail 28 extends into the corresponding fitting 46 (or more specifically the auxiliary channel 52 thereof) and thus enters the corresponding second rail 26 (or more specifically the channel 40 thereof), as shown in FIG. 13. If the first predetermined width W1 of the first object 66 is large enough, the second end portion 28b of each third rail 28 will apply a first lateral force F1 to the corresponding fitting 46 when entering the corresponding second rail 26 (or more specifically the channel 40 thereof), and the aforementioned force F of the predetermined structure 58 of the corresponding fitting 46 will be suppressed (e.g., with the first lateral force F1 and the force F acting in opposite directions, and the first lateral force F1 being greater than the force F) such that the second space K2 between the first end portion 26a of each second rail 26 and the corresponding predetermined portion 64 of the rack 22 is reduced to, for example, a third space K3 (see FIG. 13). There is no limitation on the extent to which the second spaces K2 are reduced.

Figure 14:
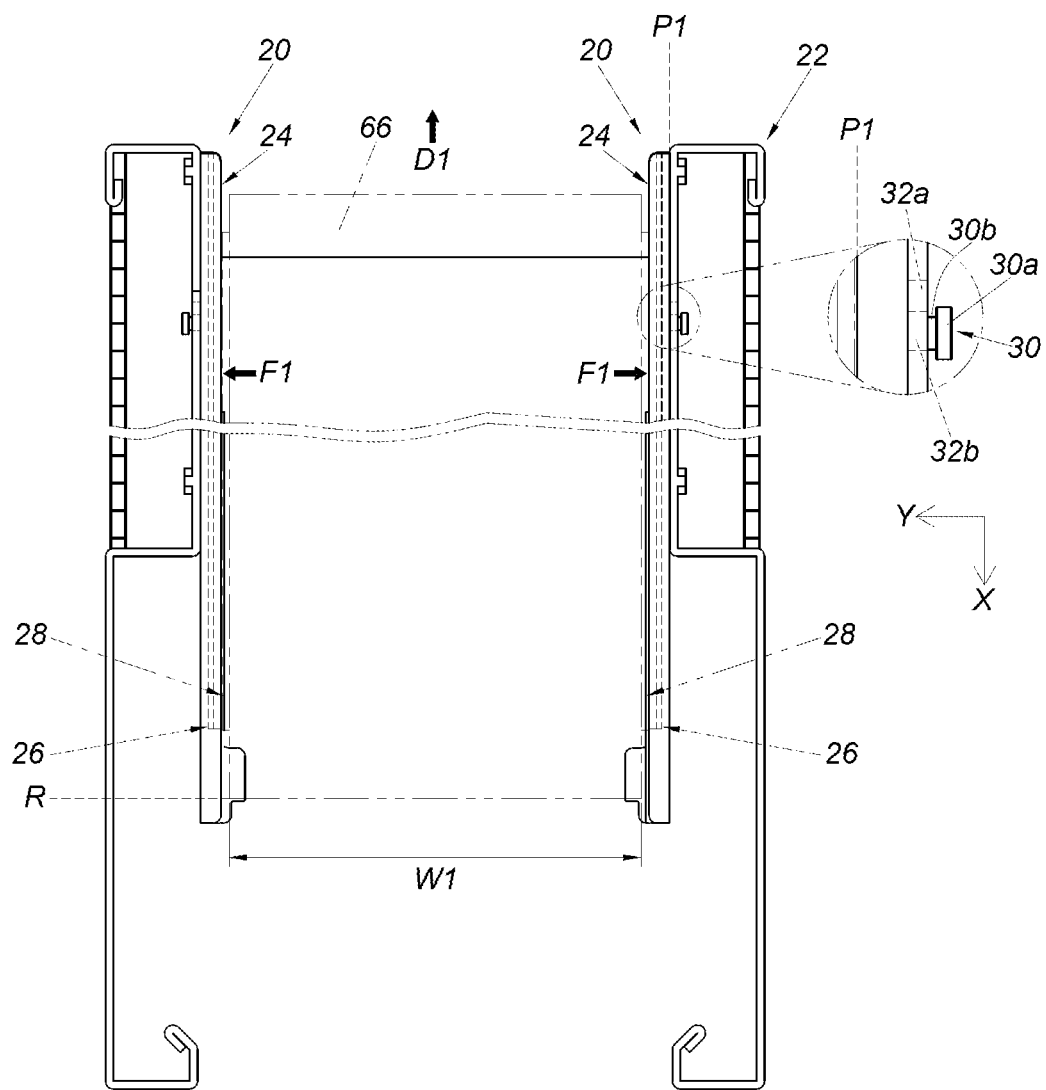
FIG. 14 shows that the two lateral sides of the rack are mounted respectively with two slide rail assemblies according to the embodiment of the present invention, and that the two lateral sides of the first object are mounted on the second rails via the third rails respectively.

When the first object 66 reaches a retracted position R (see FIG. 14) after being displaced in the predetermined direction D1 with respect to the first rails 24 via the third rails 28, the first rail 24 of each slide rail assembly 20 is moved transversely from the second position P2 (see FIG. 12 or FIG. 13) toward the first position P1, e.g., is displaced to the first position P1 (see FIG. 14), by the corresponding first lateral force F1. It should be understood, however, that in practice the final position to which the first rail 24 of each slide rail assembly 20 is displaced may lie between the first position P1 and the second position P2. When the first object 66 is mounted on the rack 22 via the slide rail assemblies 20 and with the assistance of the fittings 46, the fittings 46 can be removed from their respective mounting positions.

Figure 15:
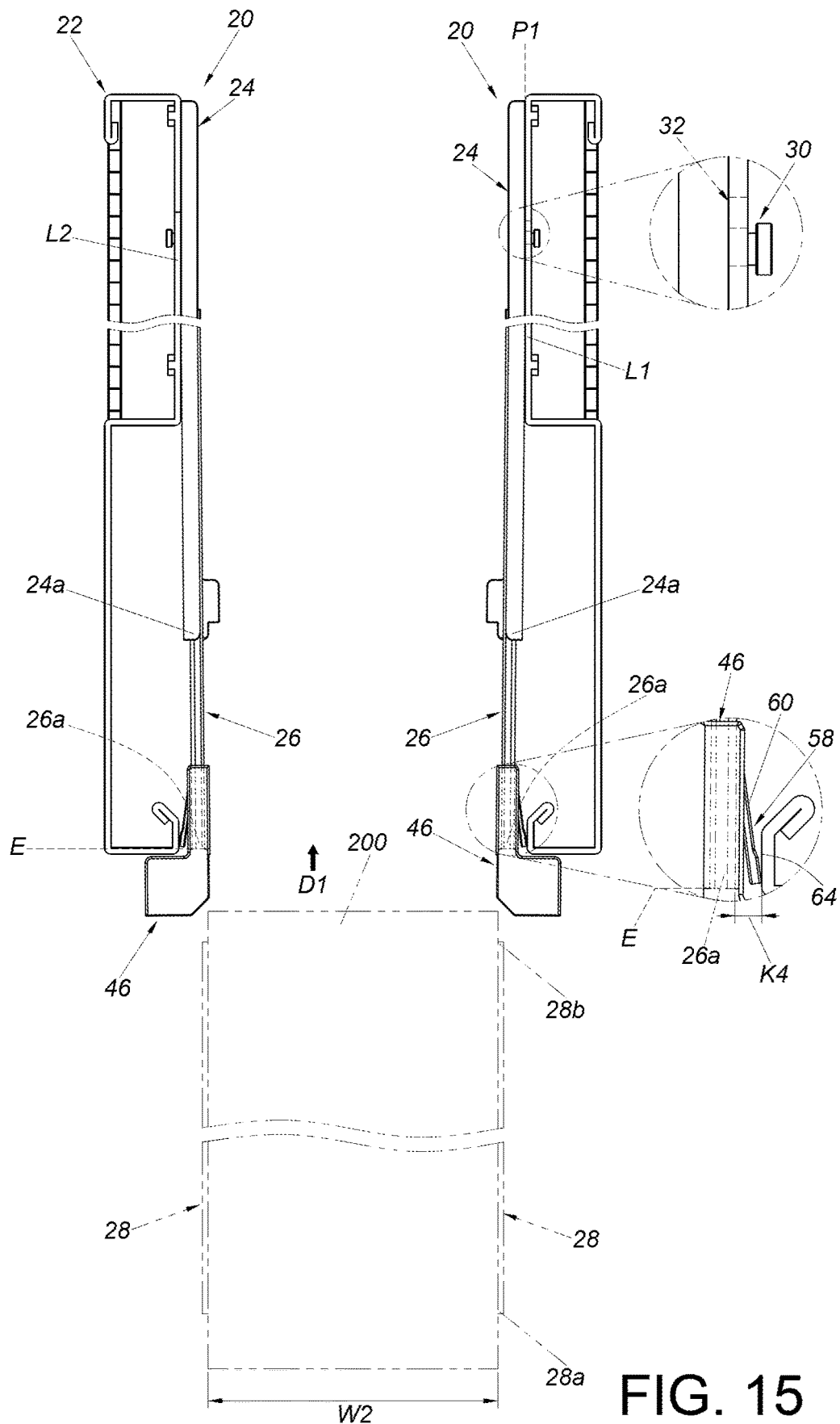
FIG. 15 shows that the two lateral sides of the rack are mounted respectively with two slide rail assemblies along with their respective fittings according to the embodiment of the present invention, and that the two lateral sides of a second object are moved in the predetermined direction via the third rails in order to be mounted to the second rails respectively.
Figure 16:
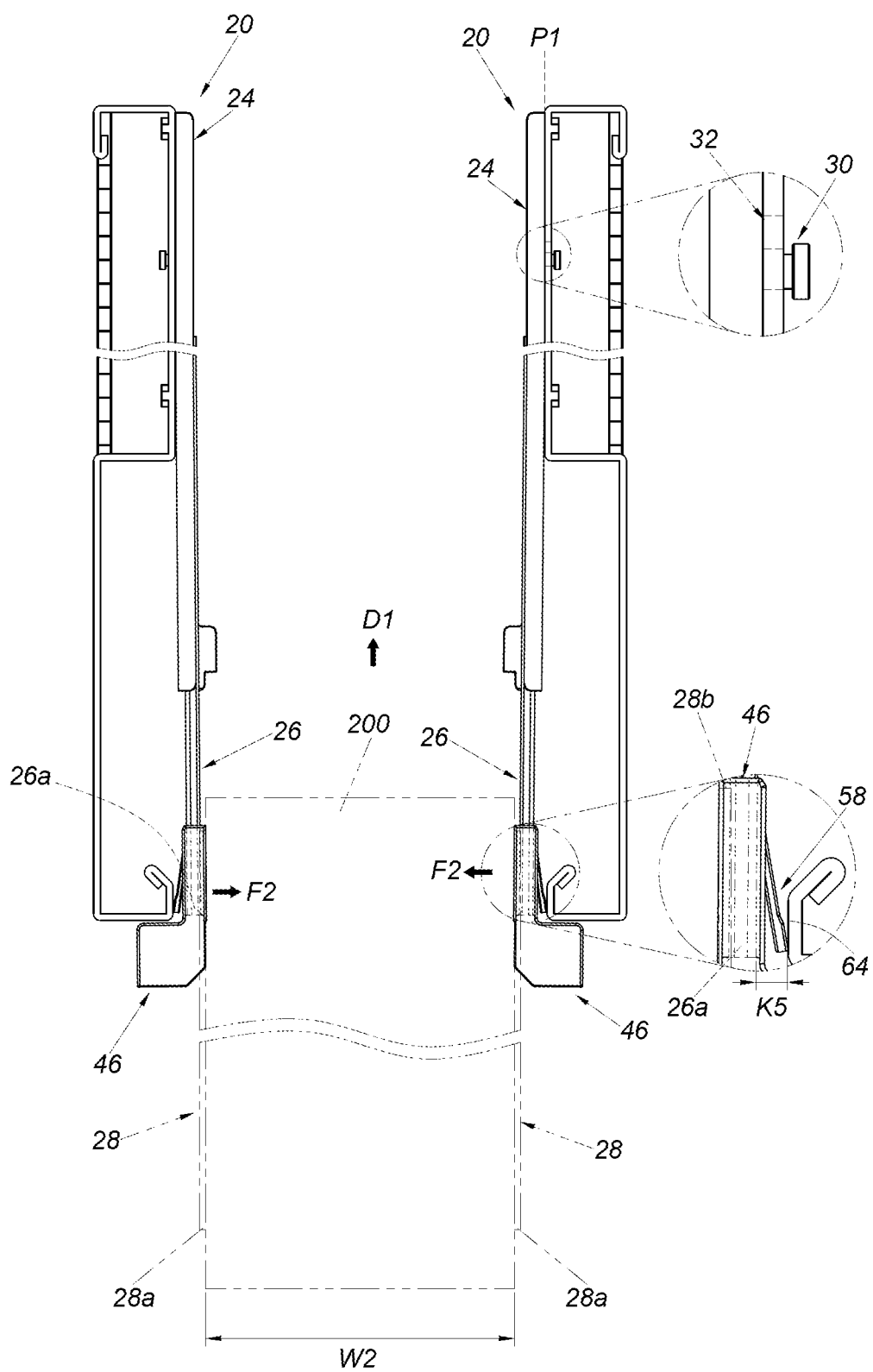
FIG. 16 shows that the two lateral sides of the rack are mounted respectively with two slide rail assemblies along with their respective fittings according to the embodiment of the present invention, and that the two lateral sides of the second object are further moved in the predetermined direction via the third rails in order to be mounted on the second rails respectively.
Figure 17:
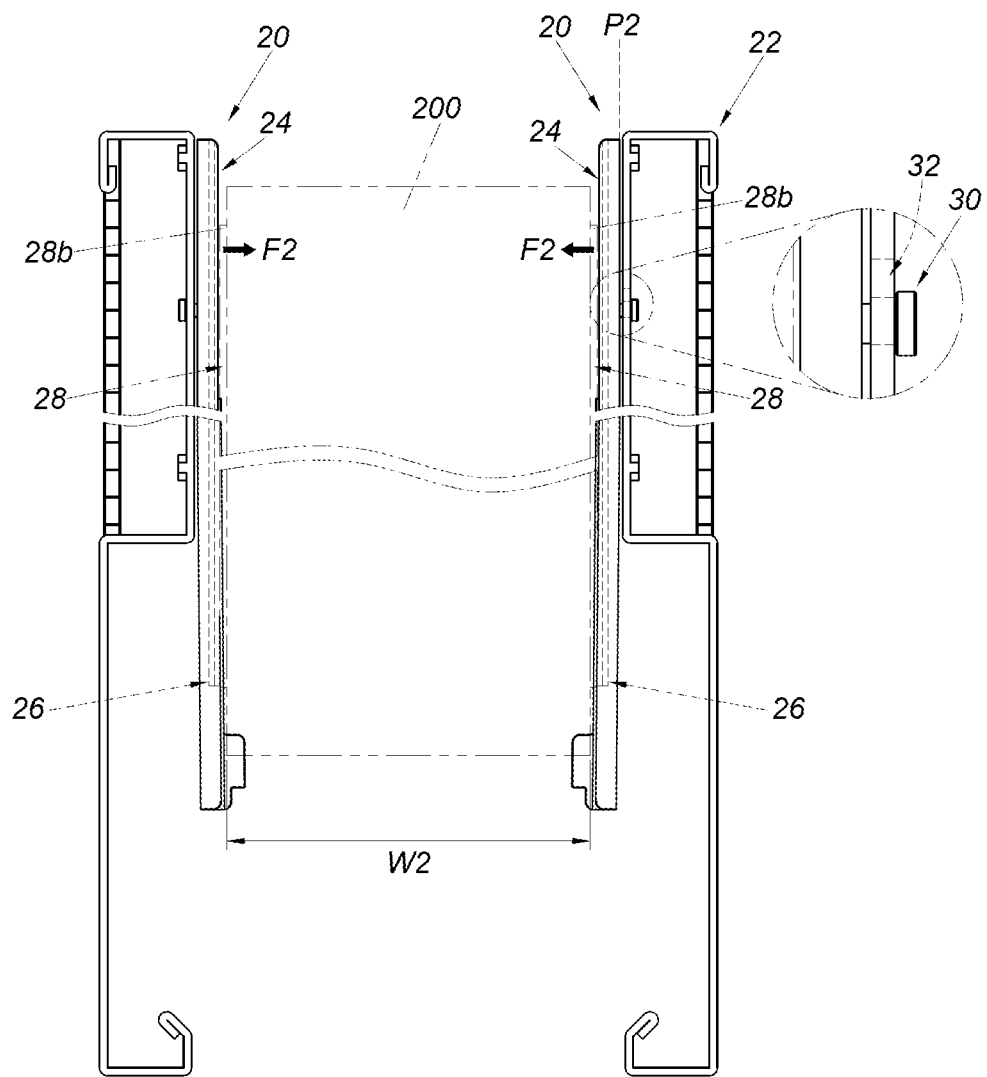
FIG. 17 shows that the two lateral sides of the rack are mounted respectively with two slide rail assemblies according to the embodiment of the present invention, and that the two lateral sides of the second object are mounted on the second rails via the third rails respectively.

FIG. 15, FIG. 16, and FIG. 17 show another embodiment of the present invention. Unlike the embodiment depicted in FIG. 12 through FIG. 14, in which the first rail 24 of each slide rail assembly 20 is moved with respect to the rack 22 from the second position P2 to the first position P1 when the first object 66 is mounted to the second rails 26 via the third rails 28 respectively, the embodiment depicted in FIG. 15 through FIG. 17 is such that the first rail 24 of each slide rail assembly 20 is moved with respect to the rack 22 from the first position P1 to the second position P2 when a second object 200 is mounted to the second rails 26 via the third rails 28 respectively.

More specifically, the second object 200 has a second predetermined width W2 less than the first predetermined width W1 of the first object 66. In FIG. 15, the first rail 24 of each slide rail assembly 20 is at the first position P1 with respect to the rack 22, and the second rail 26 of each slide rail assembly 20 is at the extended position E with respect to the corresponding first rail 24. While the two lateral sides of the second object 200 are being mounted to the second rails 26 in the predetermined direction D1 via the third rails 28 respectively, the second end portion 28b of each third rail 28 extends into the corresponding fitting 46 (or more specifically the auxiliary channel 52 thereof) and thus enters the corresponding second rail 26 (or more specifically the channel 40 thereof). If the second predetermined width W2 of the second object 200 is small enough, the second end portion 28b of each third rail 28 will apply a second lateral force F2 (which acts in the opposite direction of the first lateral force F1) to the corresponding fitting 46 when entering the corresponding second rail 26 (or more specifically the channel 40 thereof) such that the space between the first end portion 26a of each second rail 26 and the corresponding predetermined portion 64 of the rack 22 is slightly enlarged, for example from a fourth space K4 (see FIG. 15) to a fifth space K5 (see FIG. 16). When the second object 200 reaches a retracted position (see FIG. 17) after being displaced in the predetermined direction D1 with respect to the first rails 24 via the third rails 28, the first rail 24 of each slide rail assembly 20 is moved transversely from the first position P1 (see FIG. 15 or FIG. 16) toward the second position P2, e.g., is displaced to the second position P2 (see FIG. 17), by the corresponding second lateral force F2. It should be understood, however, that in practice the final position to which the first rail 24 of each slide rail assembly 20 is displaced may lie between the first position P1 and the second position P2. When the second object 200 is mounted on the rack 22 via the slide rail assemblies 20 and with the assistance of the fittings 46, the fittings 46 can be removed from their respective mounting positions.

It can be known from the above that the slide rail assembly 20 disclosed herein and its slide rail kit preferably have the following features:

1. The first rail 24 can be moved transversely with respect to the rack 22 between the first position P1 and the second position P2. One of the advantages of this configuration is that it provides a mounting tolerance between the object mounted on the third rail 28 and the rack 22. For example, the slide rail assembly 20 allows objects of different predetermined widths (e.g., the first object 66 and the second object 200) to be accommodated between the two lateral sides of the rack 22 separately.

2. The fitting 46 is mounted on the second rail 26 in a detachable manner, and the third rail 28 can be guided by the at least one guiding structure (e.g., the first guiding portion 54a, the second guiding portion 54b, or the third guiding portion 56) while being outside the channel 40 of the second rail 26, in order to enter the channel 40 of the second rail 26 rapidly. The fitting 46, however, is not necessarily mounted on the second rail 26 and may be detachably mounted on the rack 22 instead. That is to say, there is no limitation on the mounting position of the fitting 46, provided that the at least one guiding structure can guide the third rail 28 into the channel 40 of the second rail 26 from outside the channel 40 of the second rail 26.

3. The elasticity of the predetermined structure 58 of the fitting 46 provides a mounting tolerance between the first rail 24, the rack 22, and the object to be mounted on the rack 22 through the slide rail assembly 20.

While the present invention has been disclosed through the preferred embodiments described above, those embodiments are not intended to be restrictive of the scope of the invention. The scope of the patent protection sought by the applicant is defined by the appended claims.

What is claimed is:

1. A slide rail assembly adapted for a rack, the slide rail assembly comprising:
   a first rail movably mounted on the rack, wherein the first rail is transversely movable with respect to the rack between a first position and a second position;
   a second rail movably mounted on the first rail, wherein the second rail is longitudinally displaceable with respect to the first rail, and the second rail includes a first end portion, a second end portion, and a channel located between the first end portion and the second end portion, the second rail further including a first wall, a second wall, and a longitudinal wall connected between the first wall and the second wall of the second rail, and the first wall, the second wall, and the longitudinal wall of the second rail jointly define the channel;
   a fitting including at least one guiding structure corresponding to the channel of the second rail, a first portion, a second portion, and a side portion connected between the first portion and the second portion; and the first portion, the second portion, and the side portion jointly define an auxiliary channel corresponding to the channel of the second rail, the fitting having two opposite sides defined respectively as a first side and a second side, the auxiliary channel and the at least one guiding structure being located on the first side, the fitting is further being provided with a predetermined structure on the second side, and the predetermined structure is configured for contact with the rack; and
   a third rail;
   wherein the third rail is able to be guided by the at least one guiding structure of the fitting while being outside the channel of the second rail and thus enter the channel of the second rail.

2. The slide rail assembly of claim 1, wherein the fitting is configured to be disposed adjacent to the first end portion of the second rail.

3. The slide rail assembly of claim 2, wherein the fitting is detachably mounted on the second rail such that the first portion, the second portion, and the side portion of the fitting are adjacent to the first wall, the second wall, and the longitudinal wall of the second rail respectively.

4. The slide rail assembly of claim 1, wherein the first rail being transversely movable with respect to the rack between the first position and the second position provides a mounting tolerance between an object mounted on the third rail and the rack.

5. A slide rail assembly adapted for a rack, the slide rail assembly comprising:
   a first rail movably mounted on the rack, wherein the first rail is transversely movable with respect to the rack between a first position and a second position;
   a second rail movably mounted on the first rail, wherein the second rail is longitudinally displaceable with respect to the first rail, the second rail including a first wall, a second wall, a longitudinal wall connected between the first wall and the second wall of the second rail, a first end portion, a second end portion and a channel, the first wall, the second wall, and the longitudinal wall of the second rail jointly defining the channel, and the channel is located between the first end portion and the second end portion of the second rail;
   a fitting including a first portion, a second portion, a side portion connected between the first portion and the second portion, and at least one guiding structure; and the first portion, the second portion, and the side portion jointly define an auxiliary channel corresponding to the channel of the second rail, the fitting having two opposite sides defined respectively as a first side and a second side, the auxiliary channel and the at least one guiding structure being located on the first side, the fitting being further provided with a predetermined structure on the second side, and the predetermined structure being configured for contact with the rack; and
   a third rail being configured to be guided by the at least one guiding structure of the fitting while being outside the channel of the second rail and thus enter the channel of the second rail;
   wherein when the second rail is at an extended position with respect to the first rail, the first end portion of the second rail extends beyond a first end portion of the first rail, and the fitting is configured to be detachably mounted on the first end portion of the second rail.

6. The slide rail assembly of claim 5, wherein the at least one guiding structure of the fitting includes an inclined surface or a curved surface.

7. The slide rail assembly of claim 5, wherein the first portion, the second portion, and the side portion of the fitting are respectively adjacent to the first wall, the second wall, and the longitudinal wall of the second rail when the fitting is mounted on the second rail.

8. The slide rail assembly of claim 5, wherein the first rail being transversely movable with respect to the rack between the first position and the second position makes it possible to mount objects of different predetermined widths on the third rail separately.

* * * * *